(12) United States Patent
Lauber et al.

(10) Patent No.: US 10,522,376 B2
(45) Date of Patent: Dec. 31, 2019

(54) MULTI-STEP IMAGE ALIGNMENT METHOD FOR LARGE OFFSET DIE-DIE INSPECTION

(71) Applicant: KLA-TENCOR CORPORATION, Milpitas, CA (US)

(72) Inventors: Jan Lauber, San Francisco, CA (US); Himanshu Vajaria, Milpitas, CA (US); Yong Zhang, Cupertino, CA (US)

(73) Assignee: KLA-Tencor Corporation, Milpitas, CA (US)

( * ) Notice: Subject to any disclaimer, the term of this patent is extended or adjusted under 35 U.S.C. 154(b) by 0 days.

(21) Appl. No.: 16/160,515

(22) Filed: Oct. 15, 2018

(65) Prior Publication Data

US 2019/0122913 A1 Apr. 25, 2019

Related U.S. Application Data

(60) Provisional application No. 62/575,304, filed on Oct. 20, 2017.

(51) Int. Cl.
*H01L 21/67* (2006.01)
*G06T 7/00* (2017.01)
*G06T 7/73* (2017.01)
*G06T 7/33* (2017.01)
*G06T 3/00* (2006.01)
*G06T 3/20* (2006.01)
*G06T 3/60* (2006.01)

(52) U.S. Cl.
CPC ...... *H01L 21/67288* (2013.01); *G06T 3/0068* (2013.01); *G06T 3/20* (2013.01); *G06T 3/608* (2013.01); *G06T 7/001* (2013.01); *G06T 7/337* (2017.01); *G06T 7/74* (2017.01); *G06T 2207/20021* (2013.01); *G06T 2207/20056* (2013.01); *G06T 2207/20081* (2013.01); *G06T 2207/30148* (2013.01)

(58) Field of Classification Search
CPC . H01L 21/67288; G06T 3/0068; G06T 3/608; G06T 3/20; G06T 7/001; G06T 7/337; G06T 7/74; G06T 2207/20081; G06T 2207/30148; G06T 2207/20021; G06T 2207/20056
See application file for complete search history.

(56) References Cited

U.S. PATENT DOCUMENTS

| | | | | |
|---|---|---|---|---|
| 7,323,897 B2 * | 1/2008 | Mayder | ............... | G01R 35/005 324/750.02 |
| 7,433,509 B1 * | 10/2008 | Zhou | ................... | G06K 9/3275 382/144 |
| 8,045,790 B2 * | 10/2011 | Zhou | ................... | G06K 9/3275 382/144 |
| 9,773,194 B2 * | 9/2017 | Rosoman | ............. | G06K 9/3258 |

(Continued)

OTHER PUBLICATIONS

ISA/KR, International Search Report for PCT/US2018/056600 dated Feb. 14, 2019.

*Primary Examiner* — James M Pontius
(74) *Attorney, Agent, or Firm* — Hodgson Russ LLP

(57) ABSTRACT

A die-die inspection image can be aligned using a method or system configured to receive a reference image and a test image, determine a global offset and rotation angle from local sections on the reference image and test image, and perform a rough alignment de-skew of the test image prior to performing a fine alignment.

20 Claims, 9 Drawing Sheets

(56) References Cited

U.S. PATENT DOCUMENTS

| | | |
|---|---|---|
| 10,204,416 B2 * | 2/2019 | Jain .................. G06T 7/001 |
| 2005/0194535 A1 | 9/2005 | Noji et al. |
| 2006/0132162 A1 * | 6/2006 | Mayder ............. G01R 35/005 |
| | | 324/750.02 |
| 2008/0050008 A1 | 2/2008 | Oaki |
| 2011/0213479 A1 | 9/2011 | Wahlsten et al. |
| 2016/0093040 A1 | 3/2016 | Sousa et al. |
| 2017/0047195 A1 | 2/2017 | Lee et al. |
| 2017/0220898 A1 * | 8/2017 | Rosoman ........... G06K 9/00664 |
| 2017/0228866 A1 * | 8/2017 | Jain .................. G06T 7/001 |

* cited by examiner

MULTI-STEP IMAGE ALIGNMENT METHOD FOR LARGE OFFSET DIE-DIE INSPECTION

CROSS REFERENCE TO RELATED APPLICATIONS

This application claims priority to U.S. Provisional Application No. 62/575,304, filed on Oct. 20, 2017, the disclosure of which is hereby incorporated by reference.

FIELD OF THE DISCLOSURE

The disclosure generally relates to identifying defects in semiconductor devices.

BACKGROUND OF THE DISCLOSURE

Evolution of the semiconductor manufacturing industry is placing greater demands on yield management and, in particular, on metrology and inspection systems. Critical dimensions continue to shrink, yet the industry needs to decrease time for achieving high-yield, high-value production. Minimizing the total time from detecting a yield problem to fixing it determines the return-on-investment for a semiconductor manufacturer.

Fabricating semiconductor devices, such as logic and memory devices, typically includes processing a semiconductor wafer using a large number of fabrication processes to form various features and multiple levels of the semiconductor devices. For example, lithography is a semiconductor fabrication process that involves transferring a pattern from a reticle to a photoresist arranged on a semiconductor wafer. Additional examples of semiconductor fabrication processes include, but are not limited to, chemical-mechanical polishing (CMP), etch, deposition, and ion implantation. Multiple semiconductor devices may be fabricated in an arrangement on a single semiconductor wafer and then separated into individual semiconductor devices.

Inspection processes are used at various steps during semiconductor manufacturing to detect defects on wafers to promote higher yield in the manufacturing process and, thus, higher profits. Inspection has always been an important part of fabricating semiconductor devices such as integrated circuits (ICs). However, as the dimensions of semiconductor devices decrease, inspection becomes even more important to the successful manufacture of acceptable semiconductor devices because smaller defects can cause the devices to fail. For instance, as the dimensions of semiconductor devices decrease, detection of defects of decreasing size has become necessary because even relatively small defects may cause unwanted aberrations in the semiconductor devices.

Previously used methods of die-die alignment are slow when the offsets between the images exceed a few pixels. Faster methods involve measuring the offsets in the frequency space, but these methods do not take any image rotation into account and are computation-intensive. Full image alignment with large offsets and rotations with the previous method limits the number of wafers that can be inspected per hour and have limited sensitivity to defects on the wafer surface.

Therefore, improved defect identification methods and systems are needed.

SUMMARY OF THE DISCLOSURE

According to one embodiment of the present disclosure is a method for obtaining an aligned die-die inspection image, comprising, at a processor, receiving a reference image and a test image. Using the processor, a first local section from the reference image and a second local section from the test image are selected, an estimated rotation offset and an estimated translation offset from the first local section and the second local section are determined, a rough alignment is performed, thereby making a partially-aligned test image, and a fine alignment is performed on the partially-aligned test image.

Another embodiment of the present disclosure is a non-transitory computer-readable storage medium, comprising one or more programs for executing steps on one or more computing devices. These steps can include, in any appropriate order, receiving a reference image and test image; selecting a first local section from the reference image and a second local section from the test image; determining an estimated rotation offset and translation offset from the first local section and the second local section; performing a rough alignment on the test image thereby making a partially-aligned test image; and performing a fine alignment on the partially-aligned test image to obtain an aligned die-die inspection image.

Another embodiment of the present disclosure is a semiconductor die-die inspection system comprising a sensor to capture images of features of a die and a computing system. The sensor and computing system can comprise a beam source, a stage, a detector, and a processor. The processor can be in electronic communication with the detector. The processor can be further configured to receive a reference image and a test image, select a first local section from the reference image and a second local section from the test image, and determine the estimated rotation offset and estimated translation offset from the first local section and the second local section. The processor can be configured to perform a rough alignment of a test image, thereby making a partially-aligned test image, and a fine alignment of the partially-aligned test image.

The beam source can be a light source or an electron beam source. The beam source can include a broadband plasma source, electron beam source, lamp, or laser. The beam source can emit electrons or photons. In some embodiments, the beam source can also emit light, which can be infrared, visible, ultraviolet, or x-ray light.

The beam can be a light beam from a light source or an electron beam from an electron beam source.

The stage can be configured to hold a wafer in a path of a beam produced by the beam source.

The detector can be configured to receive a portion of the beam reflected from the wafer.

According to various embodiments of the present disclosure:

The rough alignment of the test image can comprise a test image de-skew. The rough alignment can thereby make a partially-aligned test image.

The fine alignment can comprise partitioned translation. The partitioned translation on the partially-aligned test image can thereby obtain an aligned die-die inspection image.

The reference image or test image can comprise rows and columns of pixels.

The test image de-skew can comprise determining a skew angle of the test image and de-skewing the test image.

The skew comparison can comprise performing a pattern recognition of one or more prominent features in the test image to determine the skew angle.

In some instances, the skew comparison can be performed using a machine learning module to determine the skew angle.

The skew angle of the test image can be determined by performing a skew comparison of the first local section from the reference image and the second local section from the test image. The skew comparison can comprise performing fast Fourier transforms on the first local section from the reference image and on the second local section from the test image to obtain a reference scene function and a test scene function, respectively, and comparing the test scene function to the reference scene function to determine the skew angle.

De-skewing the test image can comprise determining based on the skew angle, for each of the pixels in the test image, a column shift vector and a row shift vector and shifting each of the pixels according to its column shift vector and row shift vector. The column shift vector can comprise a quantity of pixels to shift collinear to the column containing the pixel and a direction. The row shift vector can comprise a quantity of pixels to shift collinear to the row containing the pixel and a direction.

The partitioned translation can comprise partitioning the reference image into at least one reference image sub-section and the test image into at least one test image sub-section, and translating the test image sub-section to align with the reference image sub-section corresponding to the test image sub-section.

BRIEF DESCRIPTION OF THE FIGURES

For a fuller understanding of the nature and objects of the disclosure, reference should be made to the following detailed description taken in conjunction with the accompanying drawings, in which.

DETAILED DESCRIPTION OF THE DISCLOSURE

Figure 1:
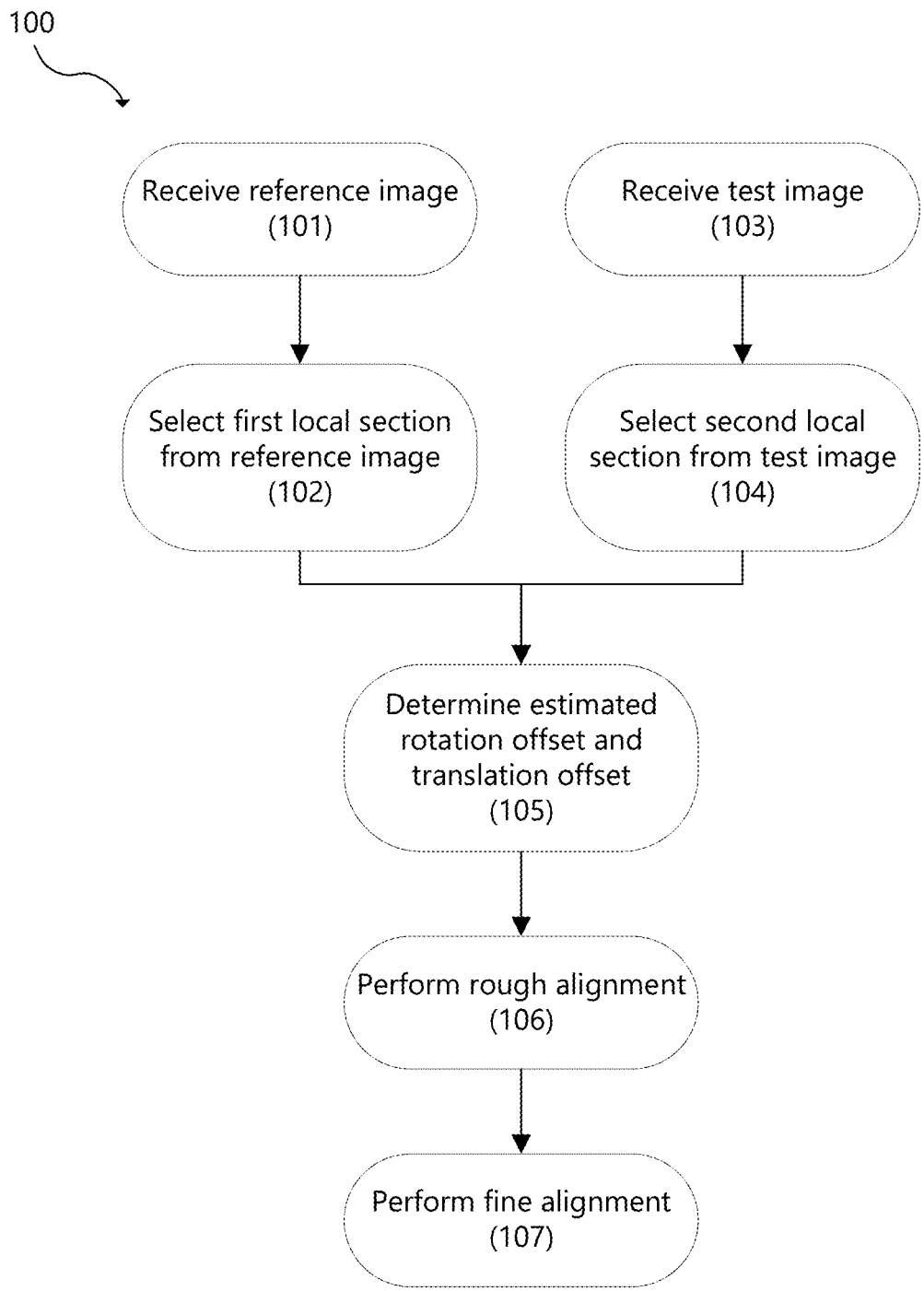
FIG. 1 is a flowchart illustrating a method for obtaining an aligned die-die inspection image in accordance with the present disclosure.

Although claimed subject matter will be described in terms of certain embodiments, other embodiments, including embodiments that do not provide all of the benefits and features set forth herein, are also within the scope of this disclosure. Various structural, logical, process step, and electronic changes may be made without departing from the scope of the disclosure. Accordingly, the scope of the disclosure is defined only by reference to the appended claims.

Embodiments disclosed herein identify a new method of aligning die images with large offsets and rotations. For example, when inspecting wafers after the dies have been diced or reconstituted, the die placements can be shifted with respect to each other by tens of microns. The present disclosure discloses an efficient two-step approach to the image alignment process in wafer inspection, which combines measuring offsets in both frequency and spatial domains.

Embodiments of this new alignment method are a computation-efficient two-step process, wherein the offsets and rotations can be first measured, for example, in the frequency domain via using fast Fourier transforms (FFT). This global offset and rotation component can then be compensated for and in a second step, the residual offset or offsets can be measured and corrected for. Embodiments disclosed herein can enable a user to inspect dies on a wafer with large offsets and rotations with greater sensitivity and precision.

Embodiments disclosed herein also can align images with local distortions. Previously these local distortions would cause alignment problems and the computing cost to overcome them would be prohibitively large.

In an embodiment of the present disclosure, a skew angle of a test wafer image as compared to a reference wafer image can be determined. From the determination of a skew angle from a local section on a reference wafer image and the local section on a test wafer image, the global offset and rotation angle can be determined. An amount each pixel needs to be shifted can be determined from the measurements. If the rotation angle exceeds a small fraction of a degree, a rough alignment may be necessary. The rough alignment can, in some embodiments, comprise rotating the test wafer image by the appropriate degree to match the reference wafer image or de-skewing the test wafer image by shifting the columns and rows of pixels it includes by a pre-determined amount. This method of de-skewing is computationally faster than 2-D image rotation. In testing some embodiments of the present disclosure, computational speed increases between 10× and 50× were observed relative to previous methods of die-die alignment.

After a rough alignment is performed, a fine alignment can be performed to complete the alignment of the die-die images. This fine alignment can measure and correct for small local misalignments. In a partitioned translation example, the reference and test images are broken down into small stripes or tiles that can be individually aligned, using a method that, once the rough alignment has been performed, is precise and efficient since the rough alignment eliminates many or even most of the offsets.

The image alignment method, software, and system embodiments described herein breaks the traditional die-die alignment process into two steps, resulting in a reduction in computation requirements. This yields a faster inspection, with improved time-to-results and therefore a reduction in cost-of-ownership for a semiconductor manufacturer.

FIG. 1 is a flowchart of a method 100 in accordance with an embodiment of the present disclosure. At 101, a reference image is received. At 102, a first local section from the reference image is selected. At 103, a test image is received. At 104, a second local section from the test image is selected. The first and second local selections can be selected by, inter alia, selecting a quadrant of an image, selecting a defined section of an image, or determining a selection based on the presence of strong features. The reference image and test image may include rows and columns of pixels. At 105, an estimated rotation offset is determined based on the first rotation offset and the second rotation offset. At 106, a rough alignment is performed on the test image to yield a partially-aligned test image using the rotation offset. At 107, a fine alignment is performed on the partially-aligned test image, yielding an aligned die-die inspection image.

In an embodiment, the estimated rotation offset may be used to determine the extent of rough alignment. This determination can be done by the use of a trigonometric function to estimate the x- and y-offsets at any given location within the test image.

Figure 2:
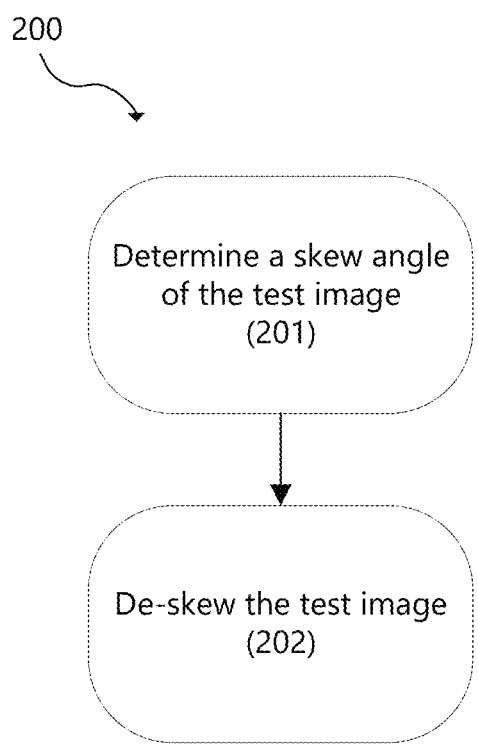
FIG. 2 is a flowchart illustrating a method of performing a test image de-skew in accordance with the present disclosure.

In an embodiment, the rough alignment step 106 can comprise a test image de-skew 200. FIG. 2 is a flowchart of a method for performing a test image de-skew 200 in accordance with an embodiment of the present disclosure. At 201, a skew angle of the test image is determined and at 202, the test image is de-skewed.

Figure 3:
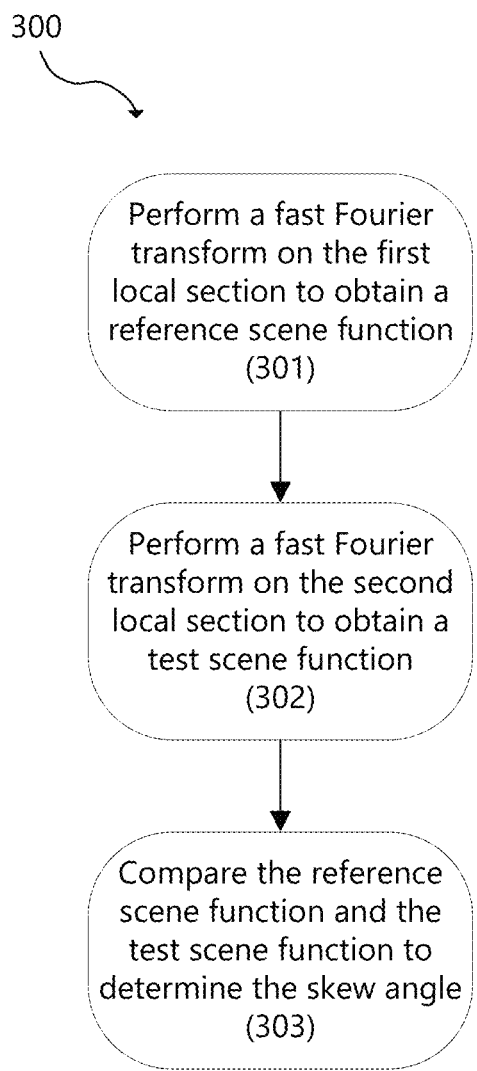
FIG. 3 is a flowchart illustrating a method of performing a skew comparison in accordance with the present disclosure.

In an embodiment, determining a skew angle of a test image 201 can comprise performing a skew comparison 300. FIG. 3 illustrates an embodiment of skew comparison 300. At 301, a fast Fourier transform is performed on the first local section from the reference image, yielding a reference scene function. At 302, a fast Fourier transform is performed on the second local section from the test image, yielding a test scene function. At 303, the test scene function is compared to the reference scene function to determine the skew angle. Skew comparison 300 can involve determining the phase, or the normalized product of the reference scene function and the test scene function. An inverse fast Fourier transform is performed on the phase to yield the offset. This offset can be determined at one or more locations on the image. The skew angle can then be the difference in offset magnitudes divided by the distance between them. Alternately, an inverse tangent of the difference in magnitudes divided by the distance between them can be the skew angle In another embodiment of the present disclosure, the skew comparison can comprise performing a pattern recognition of one or more prominent features in the test image to determine the skew angle.

In another embodiment of the present disclosure, the skew comparison can comprise using a machine learning module to determine the skew angle. The machine learning module can be a deep-learning image classification to recognize the best image features to align to.

In another embodiment of the present disclosure, the skew comparison can comprise maximizing projection contrast, using correlations and salient image information in a special domain, or other similar methods.

Figure 4:
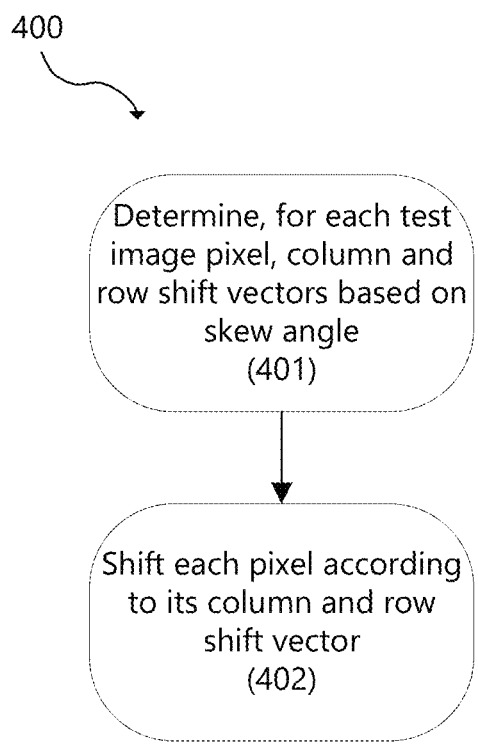
FIG. 4 is a flowchart illustrating a method of de-skewing a test image in accordance with the present disclosure.

FIG. 4 illustrates an embodiment of the present disclosure in a method 400 for de-skewing the test image. In an embodiment, de-skewing the test image 202 may comprise method 400. At 401, a column shift vector and row shift vector are determined for each pixel in the test image. The column shift vector and row shift vector are determined based on the skew angle, determined by computing the respective sines and cosines of the skew angle multiplied by the magnitude of the distance from an origin. Each column shift vector is made up of a quantity of pixels to shift collinear to the column containing the pixel and a direction. Each row shift vector is made up of a quantity of pixels to shift collinear to the row containing the pixel and a direction. In some embodiments, the column vector direction is a positive or negative direction and the row vector direction is a positive or negative direction. At 402, each pixel in the test image is shifted according to its column shift vector and row shift vector. This yields a partially-aligned test image.

Figure 5:
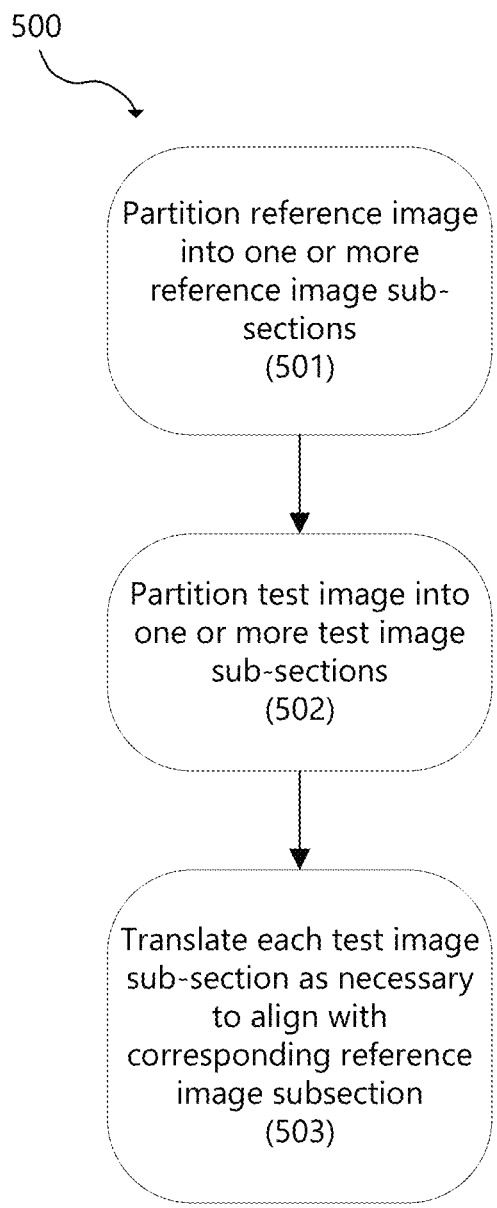
FIG. 5 is a flowchart illustrating a method of performing a partitioned translation in accordance with the present disclosure.

In another embodiment of the present disclosure, a fine alignment 107 can comprise performing a partitioned translation 500. FIG. 5 illustrates a method of partitioned translation 500 according to the present disclosure. At 501, the reference image is partitioned into one or more reference image sub-sections. At 502, the test image is partitioned into one or more test image sub-sections. Each test image sub-section corresponds to a reference image sub-section. At 503, each test image sub-section is translated to align with its corresponding reference image sub-section. The size and quantity of the reference and test image sub-sections can be determined either automatically or by a user.

In an embodiment, the translation of the test image sub-sections to align with their corresponding reference image sub-section can be performed using one of several methods. In one method, the normalized cross-correlation between the images is performed. The search range for such a normalized cross-correlation can be limited to conserve computational resources, since the rough transformation has already been performed.

In an embodiment of the present disclosure, the above methods are performed on a computing device, comprising, inter alia, a processor.

Figure 6:
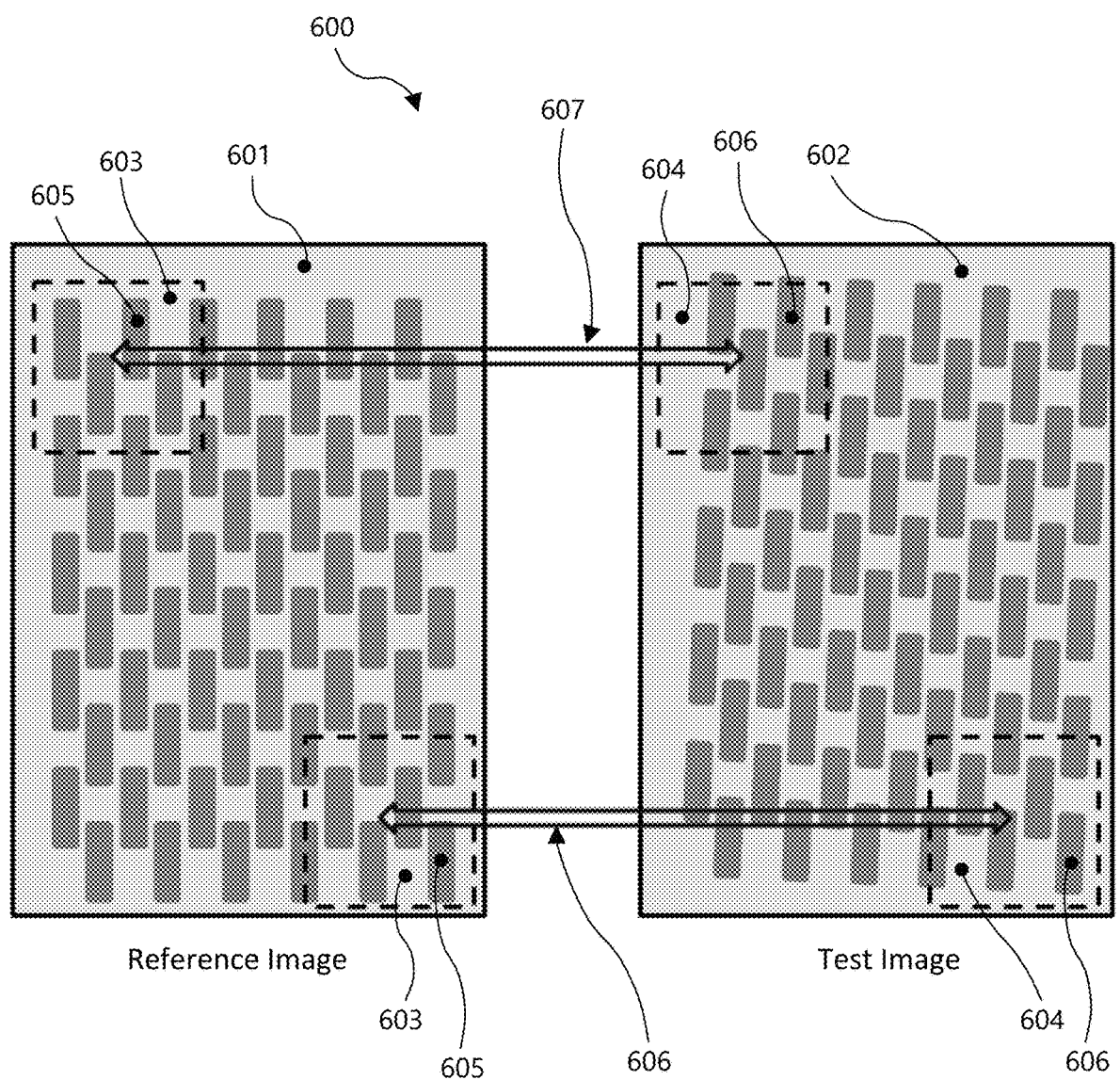
FIG. 6 illustrates performing a skew comparison in accordance with the present disclosure.

According to some embodiments of the present disclosure, FIG. 6 is a visualization of a comparison setup 600 between one or more first local sections 603 on a reference image 601 and one or more second local sections 604 on a test image 602. The first local sections 603 and second local sections 604 can be used to measure global offset and rotation by performing comparison 607 between one or more features 605 within one or more local sections 603 with one or more features 606 within one or more local sections 604. In some embodiments, comparison 607 comprises performing a fast Fourier transform of each first local section 603 and comparing it with a fast Fourier transform of each corresponding second local section 604. Due to translational and rotational offsets, if any of the features 605 and 606, the fast Fourier transform functions of the local sections 603 and 604 can be compared to determine a skew angle measurement. This measurement based on FIG. 6 can be used to de-skew the test image.

Figure 7:
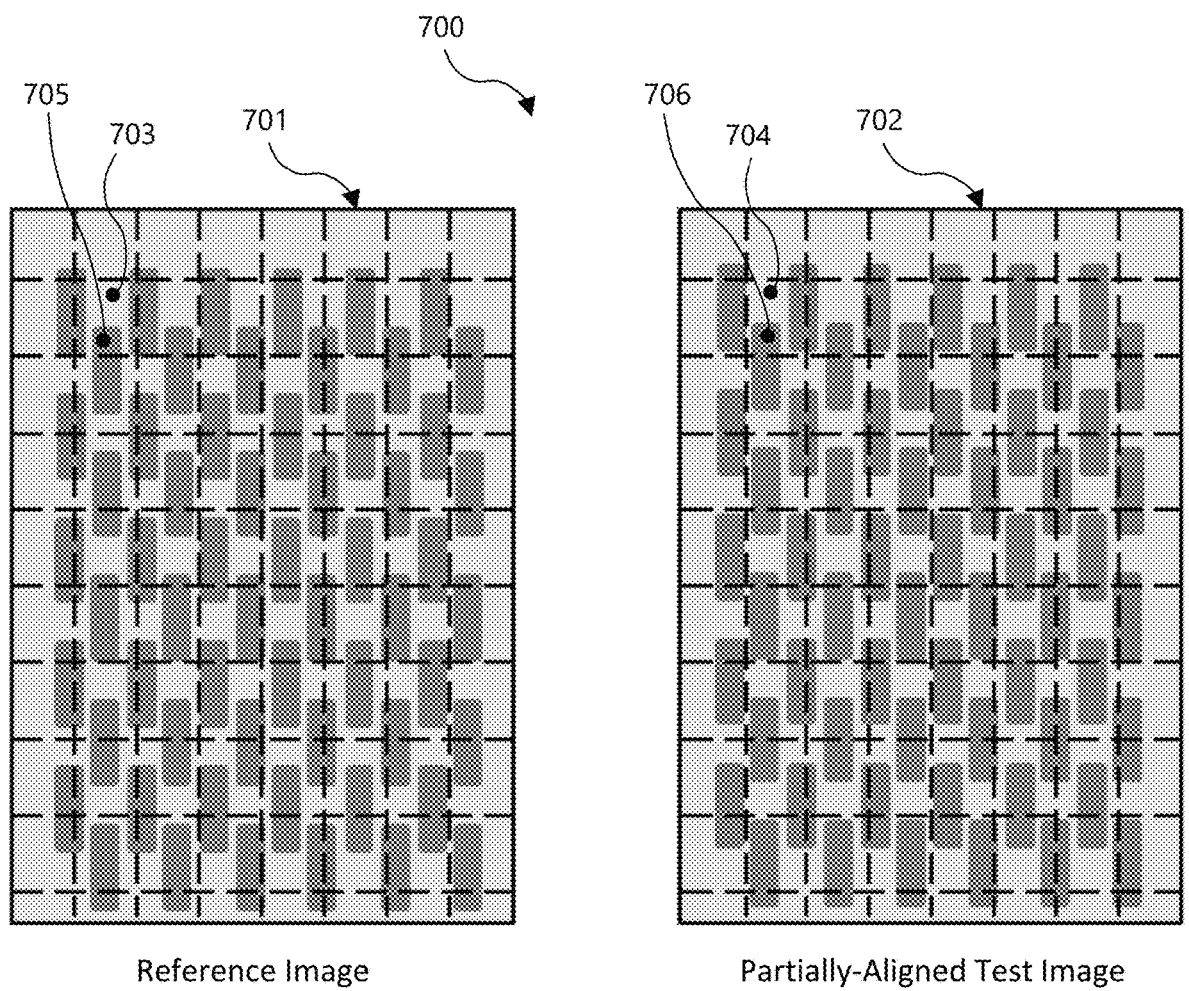
FIG. 7 illustrates performing a partitioned translation in accordance with the present disclosure.

FIG. 7 is a visualization of a partition translation setup 700 according to an embodiment of the present disclosure, comprising a reference image 701 having one or more reference image sub-sections 703 and a partially de-skewed test image 702 having one or more test image sub-sections 704. By partitioning the images into smaller sub-sections, these can be aligned based on measurements of the differences in location of one or more features 705 and 706, within one or more reference image sub-sections 703 and one or more test image sub-sections 704, respectively. The measurement based on FIG. 7 can be used to make final corrections to the image before defect detection occurs.

In another embodiment of the present disclosure, the above methods are implemented as one or more programs for execution on one or more computing devices. In this embodiment, the one or more programs are stored on a non-transitory computer-readable storage medium. The computer-implemented method may include any step(s) of any method(s) described herein.

Figure 8:
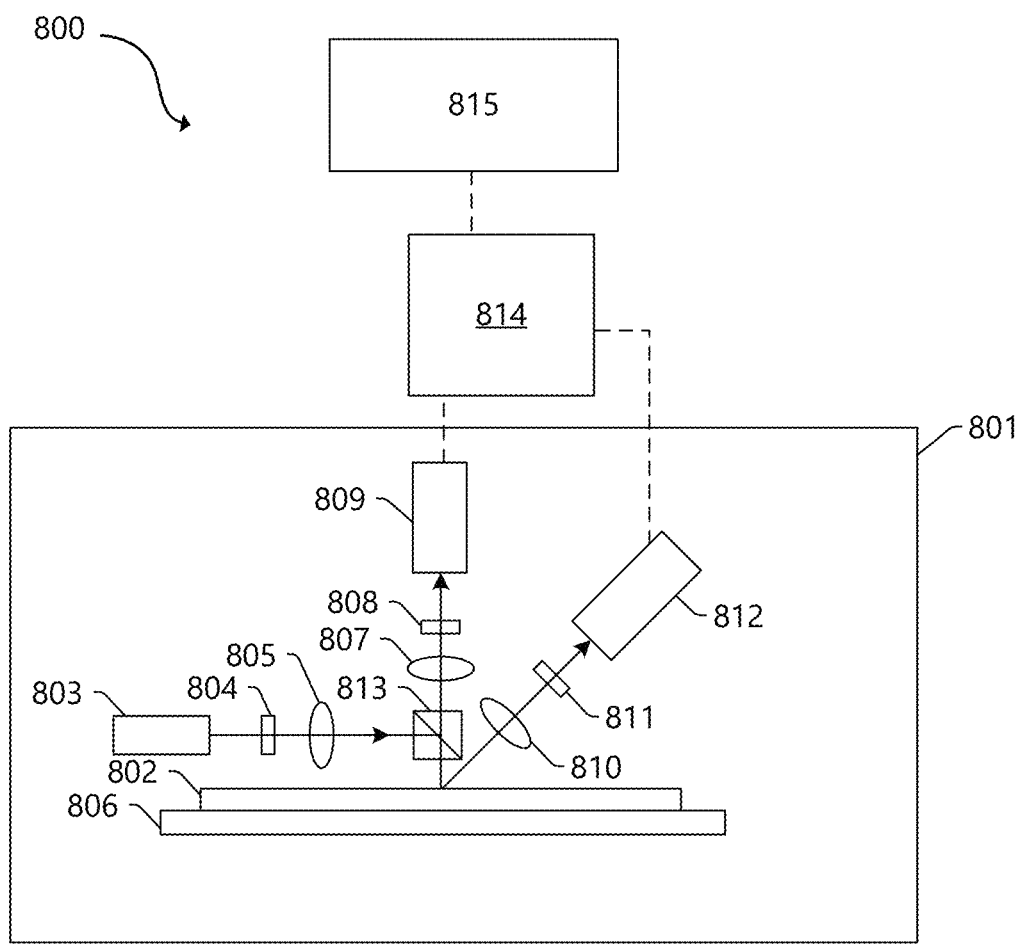
FIG. 8 illustrates a system embodiment of the present disclosure.

One embodiment of a system 800 is shown in FIG. 8. The system 800 includes optical based subsystem 801. In general, the optical based subsystem 801 is configured for generating optical based output for a specimen 802 by directing light to (or scanning light over) and detecting light from the specimen 802. In one embodiment, the specimen 802 includes a wafer. The wafer may include any wafer known in the art. In another embodiment, the specimen includes a reticle. The reticle may include any reticle known in the art.

In the embodiment of the system 800 shown in FIG. 8, optical based subsystem 801 includes an illumination subsystem configured to direct light to specimen 802. The illumination subsystem includes at least one light source. For example, as shown in FIG. 8, the illumination subsystem includes light source 803. In one embodiment, the illumination subsystem is configured to direct the light to the specimen 802 at one or more angles of incidence, which may include one or more oblique angles and/or one or more normal angles. For example, as shown in FIG. 8, light from light source 803 is directed through optical element 804 and then lens 805 to specimen 802 at an oblique angle of incidence. The oblique angle of incidence may include any suitable oblique angle of incidence, which may vary depending on, for instance, characteristics of the specimen 802.

The light source 803, or beam source, can include a broadband plasma source, lamp, or laser. In some embodiments, the beam source can also emit light, or photons, which can be in the form of infrared, visible, ultraviolet, or x-ray light.

The optical based subsystem 801 may be configured to direct the light to the specimen 802 at different angles of incidence at different times. For example, the optical based subsystem 801 may be configured to alter one or more characteristics of one or more elements of the illumination subsystem such that the light can be directed to the specimen 802 at an angle of incidence that is different than that shown in FIG. 8. In one such example, the optical based subsystem 801 may be configured to move light source 803, optical element 804, and lens 805 such that the light is directed to the specimen 802 at a different oblique angle of incidence or a normal (or near normal) angle of incidence.

In some instances, the optical based subsystem 801 may be configured to direct light to the specimen 802 at more than one angle of incidence at the same time. For example, the illumination subsystem may include more than one illumination channel, one of the illumination channels may include light source 803, optical element 804, and lens 805 as shown in FIG. 8 and another of the illumination channels (not shown) may include similar elements, which may be configured differently or the same, or may include at least a light source and possibly one or more other components such as those described further herein. If such light is directed to the specimen at the same time as the other light, one or more characteristics (e.g., wavelength, polarization, etc.) of the light directed to the specimen 802 at different angles of incidence may be different such that light resulting from illumination of the specimen 802 at the different angles of incidence can be discriminated from each other at the detector(s).

In another instance, the illumination subsystem may include only one light source (e.g., light source 803 shown in FIG. 8) and light from the light source may be separated into different optical paths (e.g., based on wavelength, polarization, etc.) by one or more optical elements (not shown) of the illumination subsystem. Light in each of the different optical paths may then be directed to the specimen 802. Multiple illumination channels may be configured to direct light to the specimen 802 at the same time or at different times (e.g., when different illumination channels are used to sequentially illuminate the specimen). In another instance, the same illumination channel may be configured to direct light to the specimen 802 with different characteristics at different times. For example, in some instances, optical element 804 may be configured as a spectral filter and the properties of the spectral filter can be changed in a variety of different ways (e.g., by swapping out the spectral filter) such that different wavelengths of light can be directed to the specimen 802 at different times. The illumination subsystem may have any other suitable configuration known in the art for directing the light having different or the same characteristics to the specimen 802 at different or the same angles of incidence sequentially or simultaneously.

In one embodiment, light source 803 may include a broadband plasma (BBP) source. In this manner, the light generated by the light source 803 and directed to the specimen 802 may include broadband light. However, the light source may include any other suitable light source such as a laser or lamp. The laser may include any suitable laser known in the art and may be configured to generate light at any suitable wavelength or wavelengths known in the art. In addition, the laser may be configured to generate light that is monochromatic or nearly-monochromatic. In this manner, the laser may be a narrowband laser. The light source 803 may also include a polychromatic light source that generates light at multiple discrete wavelengths or wavebands.

Light from optical element 804 may be focused onto specimen 802 by lens 805. Although lens 805 is shown in FIG. 8 as a single refractive optical element, it is to be understood that, in practice, lens 805 may include a number of refractive and/or reflective optical elements that in combination focus the light from the optical element to the specimen. The illumination subsystem shown in FIG. 8 and described herein may include any other suitable optical elements (not shown). Examples of such optical elements include, but are not limited to, polarizing component(s), spectral filter(s), spatial filter(s), reflective optical element(s), apodizer(s), beam splitter(s) (such as beam splitter 813), aperture(s), and the like, which may include any such suitable optical elements known in the art. In addition, the optical based subsystem 801 may be configured to alter one or more of the elements of the illumination subsystem based on the type of illumination to be used for generating the optical based output.

The optical based subsystem 801 may also include a scanning subsystem configured to cause the light to be scanned over the specimen 802. For example, the optical based subsystem 801 may include stage 806 on which specimen 802 is disposed during optical based output generation. The scanning subsystem may include any suitable mechanical and/or robotic assembly (that includes stage 806) that can be configured to move the specimen 802 such that the light can be scanned over the specimen 802. In addition, or alternatively, the optical based subsystem 801 may be configured such that one or more optical elements of the optical based subsystem 801 perform some scanning of the light over the specimen 802. The light may be scanned over the specimen 802 in any suitable fashion such as in a serpentine-like path or in a spiral path.

The optical based subsystem 801 further includes one or more detection channels. At least one of the one or more detection channels includes a detector configured to detect light from the specimen 802 due to illumination of the specimen 802 by the subsystem and to generate output responsive to the detected light. For example, the optical based subsystem 801 shown in FIG. 8 includes two detection channels, one formed by collector 807, element 808, and detector 809 and another formed by collector 810, element 811, and detector 812. As shown in FIG. 8, the two detection channels are configured to collect and detect light at different angles of collection. In some instances, both detection channels are configured to detect scattered light, and the detection channels are configured to detect tight that is scattered at different angles from the specimen 802. However, one or more of the detection channels may be configured to detect another type of light from the specimen 802 (e.g., reflected light).

As further shown in FIG. 8, both detection channels are shown positioned in the plane of the paper and the illumination subsystem is also shown positioned in the plane of the paper. Therefore, in this embodiment, both detection channels are positioned in (e.g., centered in) the plane of incidence. However, one or more of the detection channels may be positioned out of the plane of incidence. For example, the detection channel formed by collector 810, element 811, and detector 812 may be configured to collect and detect light that is scattered out of the plane of incidence. Therefore, such a detection channel may be commonly referred to as a "side" channel, and such a side channel may be centered in a plane that is substantially perpendicular to the plane of incidence.

Although FIG. 8 shows an embodiment of the optical based subsystem 801 that includes two detection channels, the optical based subsystem 801 may include a different number of detection channels (e.g., only one detection channel or two or more detection channels). In one such instance, the detection channel formed by collector 810, element 811, and detector 812 may form one side channel as described above, and the optical based subsystem 801 may include an additional detection channel (not shown) formed as another side channel that is positioned on the opposite side of the plane of incidence. Therefore, the optical based subsystem 801 may include the detection channel that includes collector 807, element 808, and detector 809 and that is centered in the plane of incidence and configured to collect and detect light at scattering angle(s) that are at or close to normal to the specimen 802 surface. This detection channel may therefore be commonly referred to as a "top" channel, and the optical based subsystem 801 may also include two or more side channels configured as described above. As such, the optical based subsystem 801 may include at least three channels (i.e., one top channel and two side channels), and each of the at least three channels has its own collector, each of which is configured to collect light at different scattering angles than each of the other collectors.

As described further above, each of the detection channels included in the optical based subsystem 801 may be configured to detect scattered light. Therefore, the optical based subsystem 801 shown in FIG. 8 may be configured for dark field (DF) output generation for specimens 802. However, the optical based subsystem 801 may also or alternatively include detection channel(s) that are configured for bright field (BF) output generation for specimens 802. In other words, the optical based subsystem 801 may include at least one detection channel that is configured to detect light specularly reflected from the specimen 802. Therefore, the optical based subsystems 801 described herein may be configured for only DF, only BF, or both DF and BF imaging. Although each of the collectors are shown in FIG. 8 as single refractive optical elements, it is to be understood that each of the collectors may include one or more refractive optical die(s) and/or one or more reflective optical element(s).

The one or more detection channels may include any suitable detectors known in the art. For example, the detectors may include photo-multiplier tubes (PMTs), charge coupled devices (CCDs), time delay integration (TDI) cameras, and any other suitable detectors known in the art. The detectors may also include non-imaging detectors or imaging detectors. In this manner, if the detectors are non-imaging detectors, each of the detectors may be configured to detect certain characteristics of the scattered light such as intensity but may not be configured to detect such characteristics as a function of position within the imaging plane. As such, the output that is generated by each of the detectors included in each of the detection channels of the optical based subsystem may be signals or data, but not image signals or image data. In such instances, a processor such as processor 814 may be configured to generate images of the specimen 802 from the non-imaging output of the detectors. However, in other instances, the detectors may be configured as imaging detectors that are configured to generate imaging signals or image data. Therefore, the optical based subsystem may be configured to generate optical images or other optical based output described herein in a number of ways.

It is noted that FIG. 8 is provided herein to generally illustrate a configuration of an optical based subsystem 801 that may be included in the system embodiments described herein or that may generate optical based output that is used by the system embodiments described herein. The optical based subsystem 801 configuration described herein may be altered to optimize the performance of the optical based subsystem 801 as is normally performed when designing a commercial output acquisition system. In addition, the systems described herein may be implemented using an existing system (e.g., by adding functionality described herein to an existing system). For some such systems, the methods described herein may be provided as optional functionality of the system (e.g., in addition to other functionality of the system). Alternatively, the system described herein may be designed as a completely new system.

In an instance, the processor 814 is in communication with the system 800.

Figure 9:
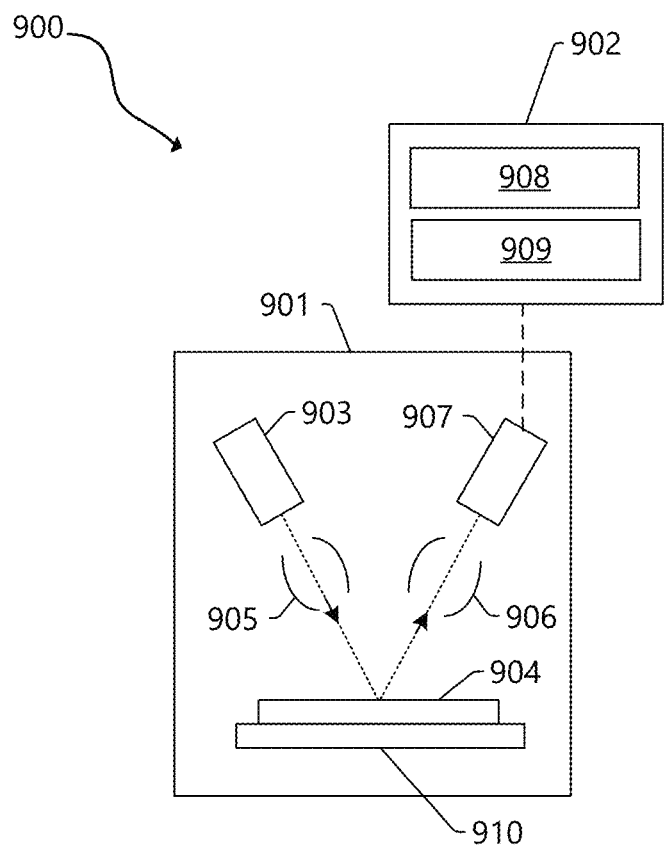
FIG. 9 illustrates another system embodiment of the present disclosure.

FIG. 9 is a block diagram of an embodiment of a system 900. The system 900 includes a wafer inspection tool (which includes the electron column 901) configured to generate images of a specimen 904, which may include a wafer or a reticle.

The wafer inspection tool includes an output acquisition subsystem that includes at least an energy source and a detector. The output acquisition subsystem may be an electron beam-based output acquisition subsystem. For example, in one embodiment, the energy directed to the specimen 904 includes electrons, and the energy detected from the specimen 904 includes electrons. In this manner, the energy source may be an electron beam source. In one such embodiment shown in FIG. 9, the output acquisition subsystem includes electron column 901, which is coupled to computer subsystem 902. A stage 910 may hold the specimen 904.

As also shown in FIG. 9, the electron column 901 includes an electron beam source 903 configured to generate electrons that are focused to specimen 904 by one or more elements 905. The electron beam source 903 may include, for example, a cathode source or emitter tip. The one or more elements 905 may include, for example, a gun lens, an anode, a beam limiting aperture, a gate valve, a beam current selection aperture, an objective lens, and a scanning subsystem, all of which may include any such suitable elements known in the art.

Electrons returned from the specimen 904 (e.g., secondary electrons) may be focused by one or more elements 906 to detector 907. One or more elements 906 may include, for example, a scanning subsystem, which may be the same scanning subsystem included in element(s) 905.

The electron column 901 also may include any other suitable elements known in the art.

Although the electron column 901 is shown in FIG. 9 as being configured such that the electrons are directed to the specimen 904 at an oblique angle of incidence and are scattered from the specimen 904 at another oblique angle, the electron beam may be directed to and scattered from the specimen 904 at any suitable angles. In addition, the electron beam-based output acquisition subsystem may be configured to use multiple modes to generate images of the specimen 904 (e.g., with different illumination angles, collection angles, etc.). The multiple modes of the electron beam-based output acquisition subsystem may be different in any image generation parameters of the output acquisition subsystem.

Computer subsystem 902 may be coupled to detector 907 as described above. The detector 907 may detect electrons returned from the surface of the specimen 904 thereby forming electron beam images of the specimen 904. The electron beam images may include any suitable electron beam images. Computer subsystem 902 may be configured to perform any of the functions described herein using the output of the detector 907 and/or the electron beam images. Computer subsystem 902 may be configured to perform any additional step(s) described herein. A system 900 that includes the output acquisition subsystem shown in FIG. 9 may be further configured as described herein.

It is noted that FIG. 9 is provided herein to generally illustrate a configuration of an electron beam-based output acquisition subsystem that may be used in the embodiments described herein. The electron beam-based output acquisition subsystem configuration described herein may be altered to optimize the performance of the output acquisition subsystem as is normally performed when designing a commercial output acquisition system. In addition, the systems described herein may be implemented using an existing system (e.g., by adding functionality described herein to an existing system). For some such systems, the methods described herein may be provided as optional functionality of the system (e.g., in addition to other functionality of the system). Alternatively, the system described herein may be designed as a completely new system.

Although the output acquisition subsystem is described above as being an electron beam-based output acquisition subsystem, the output acquisition subsystem may be an ion beam-based output acquisition subsystem. Such an output acquisition subsystem may be configured as shown in FIG. 9 except that the electron beam source may be replaced with any suitable ion beam source known in the art. In addition, the output acquisition subsystem may be any other suitable ion beam-based output acquisition subsystem such as those included in commercially available focused ion beam (FIB) systems, helium ion microscopy (HIM) systems, and secondary ion mass spectroscopy (SIMS) systems.

The computer subsystem 902 includes a processor 908 and an electronic data storage unit 909. The processor 908 may include a microprocessor, a microcontroller, or other devices.

The processor 814 or 908 or computer subsystem 902 may be coupled to the components of the system 800 or 900, respectively, in any suitable manner (e.g., via one or more transmission media, which may include wired and/or wireless transmission media) such that the processor 814 or 908, respectively, can receive output. The processor 814 or 908 may be configured to perform a number of functions using the output. The system 800 or 900 can receive instructions or other information from the processor 814 or 908, respectively. The processor 814 or 908 and/or the electronic data storage unit 815 or 909, respectively, optionally may be in electronic communication with a wafer inspection tool, a wafer metrology tool, or a wafer review tool (not illustrated) to receive additional information or send instructions. For example, the processor 814 908 and/or the electronic data storage unit 815 or 909, respectively, can be in electronic communication with a scanning electron microscope (SEM).

The processor 814 or 908 is in electronic communication with the wafer inspection tool, such as the detector 809 or 812, or detector 907, respectively. The processor 814 or 908 may be configured to process images generated using measurements from the detector 809 or 812, or detector 907, respectively. For example, the processor may perform embodiments of the methods 100, 200, 300, 400, or 500.

The processor 814 or 908 or computer subsystem 902, other system(s), or other subsystem(s) described herein may be part of various systems, including a personal computer system, image computer, mainframe computer system, workstation, network appliance, internet appliance, or other device. The subsystem(s) or system(s) may also include any suitable processor known in the art, such as a parallel processor. In addition, the subsystem(s) or system(s) may include a platform with high-speed processing and software, either as a standalone or a networked tool.

The processor 814 or 908 and electronic data storage unit 815 or 909, respectively, may be disposed in or otherwise part of the system 800 or 900, respectively, or another device. In an example, the processor 814 or 908 and electronic data storage unit 815 or 909, respectively may be part of a standalone control unit or in a centralized quality control unit. Multiple processors 814 or 908 or electronic data storage units 815 or 909, respectively, may be used.

The processor 814 or 908 may be implemented in practice by any combination of hardware, software, and firmware. Also, its functions as described herein may be performed by one unit, or divided up among different components, each of which may be implemented in turn by any combination of hardware, software and firmware. Program code or instructions for the processor 814 or 908 to implement various methods and functions may be stored in readable storage media, such as a memory in the electronic data storage unit 815 or 909, respectively, or other memory.

If the system 800 or 900 includes more than one processor 814 or 908 or computer subsystem 902, then the different subsystems may be coupled to each other such that images, data, information, instructions, etc. can be sent between the subsystems. For example, one subsystem may be coupled to additional subsystem(s) by any suitable transmission media, which may include any suitable wired and/or wireless transmission media known in the art. Two or more of such subsystems may also be effectively coupled by a shared computer-readable storage medium (not shown).

The processor 814 or 908 may be configured to perform a number of functions using the output of the system 800 or 900, respectively, or other output. For instance, the processor 814 or 908 may be configured to send the output to an electronic data storage unit 815 or 809, respectively or another storage medium. The processor 814 or 908 may be further configured as described herein.

The processor 814 or 908 or computer subsystem 902 may be part of a defect review system, an inspection system, a metrology system, or some other type of system. Thus, the embodiments disclosed herein describe some configurations that can be tailored in a number of manners for systems having different capabilities that are more or less suitable for different applications.

If the system includes more than one subsystem, then the different subsystems may be coupled to each other such that images, data, information, instructions, etc. can be sent between the subsystems. For example, one subsystem may be coupled to additional sub system(s) by any suitable transmission media, which may include any suitable wired and/or wireless transmission media known in the art. Two or more of such subsystems may also be effectively coupled by a shared computer-readable storage medium (not shown).

The processor 814 or 908 may be configured according to any of the embodiments described herein. The processor 814 or 908 also may be configured to perform other functions or additional steps using the output of the system 800 or 900, respectively, or using images or data from other sources.

The processor 814 or 908 may be communicatively coupled to any of the various components or sub-systems of system 800 or 900, respectively, in any manner known in the art. Moreover, the processor 814 or 908 may be configured to receive and/or acquire data or information from other systems (e.g., inspection results from an inspection system such as a review tool, a remote database including design data and the like) by a transmission medium that may include wired and/or wireless portions. In this manner, the transmission medium may serve as a data link between the processor 814 or 908 and other subsystems of the system 800 or 900, respectively, or systems external to system 800 or 900, respectively.

In an embodiment, processor 814 or processor 908 may be configured to carry out the steps according to an embodiment of one or more of the methods 100, 200, 300, 400, or 500.

In an embodiment, processor 814 or processor 908 may be configured to perform a rough alignment of a test image comprising a test image de-skew, thereby making a partially-aligned test image; and a fine alignment comprising partitioned translation of the partially-aligned test image.

In an embodiment, the processor 814 or processor 908 may be further configured to receive a reference image, the reference image comprising rows and columns of pixels; select a first local section from the reference image; receive a test image; the test image comprising rows and columns of pixels; select a second local section from the test image; and determine the estimated rotation offset and the estimated translation offset from the first local section and the second local section.

In an embodiment, the processor 814 or processor 908 may be further configured to perform a test image de-skew, where the test image de-skew comprises determining a skew angle of the test image; and de-skewing the test image based on the skew angle.

In an embodiment, the processor 814 or processor 908 may be further configured to determine the skew angle of the test image by performing a skew comparison of the first local section from the reference image to the second local section from the test image.

In an embodiment, the processor 814 or processor 908 may be further configured to perform a skew comparison comprising performing a fast Fourier transform on the first local section from the reference image to obtain a reference scene function; performing a fast Fourier transform on the second local section from the test image to obtain a test scene function; comparing the test scene function to the reference scene function to determine the skew angle.

In an embodiment, the processor 814 or processor 908 may be further configured to de-skew a test image, wherein de-skewing the test image comprises determining, based on the skew angle, for each pixel in the test image, a column shift vector and a row shift vector, wherein each column shift vector comprises a quantity of pixels to shift collinear to the column containing the pixel and a direction; and each row shift vector comprises a quantity of pixels to shift collinear to the row containing the pixel and a direction; and shifting each pixel according to its column shift vector and row shift vector.

In an embodiment, the processor 814 or processor 908 may be further configured to perform a fine alignment comprising of a partitioned translation, wherein the partitioned translation comprises: partitioning the reference image into one or more reference image sub-sections; partitioning the test image into one or more test image sub-sections, each test image sub-section corresponding to a reference image sub-section; and translating each test image sub-section is translated to align with its corresponding reference image sub-section.

Various steps, functions, and/or operations of system 800 or system 900 and the methods disclosed herein are carried out by one or more of the following: electronic circuits, logic gates, multiplexers, programmable logic devices, ASICs, analog or digital controls/switches, microcontrollers, or computing systems. Program instructions implementing methods such as those described herein may be transmitted over or stored on carrier medium. The carrier medium may include a storage medium such as a read-only memory, a random access memory, a magnetic or optical disk, a non-volatile memory, a solid state memory, a magnetic tape, and the like. A carrier medium may include a transmission medium such as a wire, cable, or wireless transmission link. For instance, the various steps described throughout the present disclosure may be carried out by a single processor 814 or a single processor 908 (or computer subsystem 902) or, alternatively, multiple processors 814 or multiple processors 908 (or multiple computer subsystems 902). Moreover, different sub-systems of the system 800 or system 900 may include one or more computing or logic systems. Therefore, the above description should not be interpreted as a limitation on the present disclosure but merely an illustration.

An additional embodiment relates to a non-transitory computer-readable medium storing program instructions executable on a controller for performing a computer-implemented method for determining a height of an illuminated region on a surface of a specimen 802 or 904, as disclosed herein. In particular, as shown in FIG. 8 or 9, electronic data storage unit 815 or 909 or other storage medium may contain non-transitory computer-readable medium that includes program instructions executable on the processor 814 or 908, respectively. The computer-implemented method may include any step(s) of any method(s) described herein, including embodiments of the methods 100, 200, 300, 400, or 500.

Program instructions implementing methods such as those described herein may be stored on computer-readable medium, such as in the electronic data storage unit 815, electronic data storage unit 909, or other storage medium. The computer-readable medium may be a storage medium such as a magnetic or optical disk, a magnetic tape, or any other suitable non-transitory computer-readable medium known in the art.

The program instructions may be implemented in any of various ways, including procedure-based techniques, component-based techniques, and/or object-oriented techniques, among others. For example, the program instructions may be implemented using ActiveX controls, C++ objects, Java-Beans, Microsoft Foundation Classes (MFC), Streaming SIMD Extension (SSE), or other technologies or methodologies, as desired.

The component(s) executed by the processor, can include a deep learning module (e.g., a convolutional neural network (CNN) module). The deep learning module can have one of the configurations described further herein. Rooted in neural network technology, deep learning is a probabilistic graph model with many neuron layers, commonly known as a deep architecture. Deep learning technology processes the information such as image, text, voice, and so on in a hierarchical manner. In using deep learning in the present disclosure, feature extraction is accomplished automatically using learning from data. For example, features to reference in determining rotation and translation offsets can be extracted using the deep learning module based on the one or more extracted features.

Generally speaking, deep learning (also known as deep structured learning, hierarchical learning or deep machine learning) is a branch of machine learning based on a set of algorithms that attempt to model high level abstractions in data. In a simple case, there may be two sets of neurons: ones that receive an input signal and ones that send an output signal. When the input layer receives an input, it passes on a modified version of the input to the next layer. In a deep network, there are many layers between the input and output, allowing the algorithm to use multiple processing layers, composed of multiple linear and non-linear transformations.

Deep learning is part of a broader family of machine learning methods based on learning representations of data. An observation (e.g., a feature to be extracted for reference) can be represented in many ways such as a vector of intensity values per pixel, or in a more abstract way as a set of edges, regions of particular shape, etc. Some representations are better than others at simplifying the learning task (e.g., face recognition or facial expression recognition). Deep learning can provide efficient algorithms for unsupervised or semi-supervised feature learning and hierarchical feature extraction.

Research in this area attempts to make better representations and create models to learn these representations from large-scale data. Some of the representations are inspired by advances in neuroscience and are loosely based on interpretation of information processing and communication patterns in a nervous system, such as neural coding which attempts to define a relationship between various stimuli and associated neuronal responses in the brain.

There are many variants of neural networks with deep architecture depending on the probability specification and network architecture, including, but not limited to, Deep Belief Networks (DBN), Restricted Boltzmann Machines (RBM), and Auto-Encoders. Another type of deep neural network, a CNN, can be used for feature analysis. The actual implementation may vary depending on the size of input images, the number of features to be analyzed, and the nature of the problem. Other layers may be included in the deep learning module besides the neural networks disclosed herein.

In an embodiment, the deep learning model is a machine learning model. Machine learning can be generally defined as a type of artificial intelligence (AI) that provides computers with the ability to learn without being explicitly programmed. Machine learning focuses on the development of computer programs that can teach themselves to grow and change when exposed to new data. Machine learning explores the study and construction of algorithms that can learn from and make predictions on data. Such algorithms overcome following strictly static program instructions by making data driven predictions or decisions, through building a model from sample inputs.

In some embodiments, the deep learning model is a generative model. A generative model can be generally defined as a model that is probabilistic in nature. In other words, a generative model is one that performs forward simulation or rule-based approaches. The generative model can be learned (in that its parameters can be learned) based on a suitable training set of data. In one embodiment, the deep learning model is configured as a deep generative model. For example, the model may be configured to have a deep learning architecture in that the model may include multiple layers, which perform a number of algorithms or transformations.

In another embodiment, the deep learning model is configured as a neural network. In a further embodiment, the deep learning model may be a deep neural network with a set of weights that model the world according to the data that it has been fed to train it. Neural networks can be generally defined as a computational approach which is based on a relatively large collection of neural units loosely modeling the way a biological brain solves problems with relatively large clusters of biological neurons connected by axons. Each neural unit is connected with many others, and links can be enforcing or inhibitory in their effect on the activation state of connected neural units. These systems are self-learning and trained rather than explicitly programmed and excel in areas where the solution or feature detection is difficult to express in a traditional computer program.

Neural networks typically consist of multiple layers, and the signal path traverses from front to back. The goal of the neural network is to solve problems in the same way that the human brain would, although several neural networks are much more abstract. Modern neural network projects typically work with a few thousand to a few million neural units and millions of connections. The neural network may have any suitable architecture and/or configuration known in the art.

In one embodiment, the deep learning model used for the semiconductor inspection applications disclosed herein is configured as an AlexNet. For example, an AlexNet includes a number of convolutional layers (e.g., 5) followed by a number of fully connected layers (e.g., 3) that are, in combination, configured and trained to analyze features for determining rotation and translation offsets. In another such embodiment, the deep learning model used for the semiconductor inspection applications disclosed herein is configured as a GoogleNet. For example, a GoogleNet may include layers such as convolutional, pooling, and fully connected layers such as those described further herein configured and trained to analyze features for determining rotation and translation offsets. While the GoogleNet architecture may include a relatively high number of layers (especially compared to some other neural networks described herein), some of the layers may be operating in parallel, and groups of layers that function in parallel with each other are generally referred to as inception modules. Other of the layers may operate sequentially. Therefore, GoogleNets are different from other neural networks described herein in that not all of the layers are arranged in a sequential structure. The parallel layers may be similar to Google's Inception Network or other structures.

In a further such embodiment, the deep learning model used for the semiconductor inspection applications disclosed herein is configured as a Visual Geometry Group (VGG) network. For example, VGG networks were created by increasing the number of convolutional layers while fixing other parameters of the architecture. Adding convolutional layers to increase depth is made possible by using substantially small convolutional filters in all of the layers. Like the other neural networks described herein, VGG networks were created and trained to analyze features for determining rotation and translation offsets. VGG networks also include convolutional layers followed by fully connected layers.

In some such embodiments, the deep learning model used for the semiconductor inspection applications disclosed herein is configured as a deep residual network. For example, like some other networks described herein, a deep residual network may include convolutional layers followed by fully-connected layers, which are, in combination, configured and trained for feature property extraction. In a deep residual network, the layers are configured to learn residual functions with reference to the layer inputs, instead of learning unreferenced functions. In particular, instead of hoping each few stacked layers directly fit a desired underlying mapping, these layers are explicitly allowed to fit a residual mapping, which is realized by feedforward neural networks with shortcut connections. Shortcut connections are connections that skip one or more layers. A deep residual net may be created by taking a plain neural network structure that includes convolutional layers and inserting shortcut connections which thereby takes the plain neural network and turns it into its residual learning counterpart.

In a further such embodiment, the deep learning model used for the semiconductor inspection applications disclosed herein includes one or more fully connected layers configured for analyzing features for determining rotation and translation offsets. A fully connected layer may be generally defined as a layer in which each of the nodes is connected to each of the nodes in the previous layer. The fully connected layer(s) may perform classification based on the features extracted by convolutional layer(s), which may be configured as described further herein. The fully connected layer(s) are configured for feature selection and classification. In other words, the fully connected layer(s) select features from a feature map and then analyze the input image(s) based on the selected features. The selected features may include all of the features in the feature map (if appropriate) or only some of the features in the feature map.

In some embodiments, the information determined by the deep learning model includes feature properties extracted by the deep learning model. In one such embodiment, the deep learning model includes one or more convolutional layers. The convolutional layer(s) may have any suitable configuration known in the art. In this manner, the deep learning model (or at least a part of the deep learning model) may be configured as a CNN. For example, the deep learning model may be configured as a CNN, which is usually stacks of convolution and pooling layers, to extract local features. The embodiments described herein can take advantage of deep learning concepts such as a CNN to solve the normally intractable representation inversion problem. The deep learning model may have any CNN configuration or architecture known in the art. The one or more pooling layers may also have any suitable configuration known in the art (e.g., max pooling layers) and are generally configured for reducing the dimensionality of the feature map generated by the one or more convolutional layers while retaining the most important features.

In general, the deep learning model described herein is a trained deep learning model. For example, the deep learning model may be previously trained by one or more other systems and/or methods. The deep learning model is already generated and trained and then the functionality of the model is determined as described herein, which can then be used to perform one or more additional functions for the deep learning model.

As stated above, although a CNN is used herein to illustrate the architecture of a deep learning system, the present disclosure is not limited to a CNN. Other variants of deep learning architectures may be used in embodiments. For example, Auto-Encoders, DBNs, and RBMs, can be used. Random forests also can be used.

Training data may be inputted to model training (e.g., CNN training), which may be performed in any suitable manner. For example, the model training may include inputting the training data to the deep learning model (e.g., a CNN) and modifying one or more parameters of the model until the output of the model is the same as (or substantially the same as) external validation data. Model training may generate one or more trained models, which may then be sent to model selection, which is performed using validation data. The results that are produced by each one or more trained models for the validation data that is input to the one or more trained models may be compared to the validation data to determine which of the models is the best model. For example, the model that produces results that most closely match the validation data may be selected as the best model. Test data may then be used for model evaluation of the model that is selected (e.g., the best model). Model evaluation may be performed in any suitable manner. Best model may also be sent, to model deployment in which the best model may be sent to the semiconductor inspection tool for use (post-training mode).

The steps of the method described in the various embodiments and examples disclosed herein are sufficient to carry out the methods of the present invention. Thus, in an embodiment, the method consists essentially of a combination of the steps of the methods disclosed herein. In another embodiment, the method consists of such steps.

Although the present disclosure has been described with respect to one or more particular embodiments and/or examples, it will be understood that other embodiments and/or examples of the present disclosure may be made without departing from the scope of the present disclosure.

What is claimed is:
1. A method for obtaining an aligned die-die inspection image, comprising:
   receiving a reference image at a processor, the reference image comprising rows and columns of pixels;
   selecting a first local section from the reference image using the processor;
   receiving a test image at the processor, the test image comprising rows and columns of pixels;
   selecting a second local section from the test image using the processor;
   determining, using the processor, an estimated rotation offset and an estimated translation offset from the first local section and the second local section;
   performing a rough alignment comprising a test image de-skew using the processor, thereby making a partially-aligned test image; and
   performing a fine alignment comprising partitioned translation on the partially-aligned test image to obtain an aligned die-die inspection image.

2. The method of claim 1, wherein the test image de-skew comprises:
   determining a skew angle of the test image using the processor; and
   de-skewing the test image using the processor.

3. The method of claim 2, wherein the skew angle of the test image is determined by performing a skew comparison of the first local section from the reference image and the second local section from the test image.

4. The method of claim 3, wherein the skew comparison comprises:
   performing a fast Fourier transform on the first local section from the reference image using the processor to obtain a reference scene function;
   performing a fast Fourier transform on the second local section from the test image using the processor to obtain a test scene function; and
   comparing the test scene function to the reference scene function using the processor to determine the skew angle.

5. The method of claim 3, wherein the skew comparison comprises performing a pattern recognition of one or more prominent features in the test image to determine the skew angle.

6. The method of claim 3, wherein the skew comparison is performed using a machine learning module to determine the skew angle.

7. The method of claim 2, wherein de-skewing the test image comprises:
   determining, based on the skew angle, for each of the pixels in the test image, a column shift vector and a row shift vector using the processor, wherein
      the column shift vector comprises a quantity of pixels to shift collinear to the column containing the pixel and a direction; and
      the row shift vector comprises a quantity of pixels to shift collinear to the row containing the pixel and a direction; and
   shifting each of the pixels according to its column shift vector and row shift vector using the processor.

8. The method of claim 1, wherein the partitioned translation comprises:
   partitioning, using the processor, the reference image into at least one reference image sub-section;
   partitioning, using the processor, the test image into at least one test image sub-section; and
   translating, using the processor, the test image sub-section to align with the reference image sub-section corresponding to the test image sub-section.

9. A non-transitory computer-readable storage medium, comprising one or more programs for executing the following steps on one or more computing devices:
   receive a reference image, the reference image comprising rows and columns of pixels;
   select a first local section from the reference image;
   receive a test image, the test image comprising rows and columns of pixels;
   select a second local section from the test image;
   determine an estimated rotation offset and an estimated translation offset from the first local section and the second local section;
   perform a rough alignment on the test image comprising a test image de-skew, thereby making a partially-aligned test image; and
   perform a fine alignment comprising partitioned translation on the partially-aligned test image to obtain an aligned die-die inspection image.

10. The non-transitory computer-readable storage medium of claim 9, wherein the test image de-skew comprises:
    determining a skew angle of the test image; and
    de-skewing the test image, comprising:
       determining, based on the skew angle, for each of the pixels in the test image, a column shift vector and a row shift vector, wherein
          the column shift vector comprises a quantity of pixels to shift collinear to the column containing the pixel and a direction; and
          the row shift vector comprises a quantity of pixels to shift collinear to the row containing the pixel and a direction; and
       shifting each of the pixels according to its column shift vector and row shift vector.

11. The non-transitory computer-readable storage medium of claim 10, wherein the skew angle of the test image is determined by performing a skew comparison of the first local section from the reference image and the second local section from the test image.

12. The non-transitory computer-readable storage medium of claim 11, wherein the skew comparison comprises:
    performing a fast Fourier transform on the first local section from the reference image to obtain a reference scene function;
    performing a fast Fourier transform on the second local section from the test image to obtain a test scene function; and
    comparing the test scene function to the reference scene function to determine the skew angle.

13. The non-transitory computer-readable storage medium of claim 9, wherein the partitioned translation comprises:
    partitioning the reference image into at least one reference image sub-section;
    partitioning the test image into at least one test image sub-section; and
    translating the test image sub-section to align with the reference image sub-section corresponding to the test image sub-section.

14. A semiconductor die-die inspection system comprising a sensor to capture images of features of a die and a computing system comprising:
    a beam source, wherein the beam source is a light source or an electron beam source;
    a stage configured to hold a wafer in a path of a beam produced by the beam source, wherein the beam is a light beam from the light source or an electron beam from the electron beam source;
    a detector configured to receive a portion of the beam reflected from the wafer; and
    a processor in electronic communication with the detector configured to perform:
       a rough alignment of a test image comprising a test image de-skew, thereby making a partially-aligned test image, and
       a fine alignment comprising partitioned translation of the partially-aligned test image.

15. The semiconductor die-die inspection system of claim 14, wherein the processor is further configured to:
    receive a reference image, the reference image comprising rows and columns of pixels;
    select a first local section from the reference image;
    receive a test image, the test image comprising rows and columns of pixels;

select a second local section from the test image; and determine the estimated rotation offset and the estimated translation offset from the first local section and the second local section.

16. The semiconductor die-die inspection system of claim 14, wherein the test image de-skew comprises:

determining a skew angle of the test image; and de-skewing the test image.

17. The semiconductor die-die inspection system of claim 16, wherein the skew angle of the test image is determined by performing a skew comparison of the first local section from the reference image and the second local section from the test image.

18. The semiconductor die-die inspection system of claim 17, wherein the skew comparison comprises:

performing a fast Fourier transform on the first local section from the reference image to obtain a reference scene function;

performing a fast Fourier transform on the second local section from the test image to obtain a test scene function; and comparing the test scene function to the reference scene function to determine the skew angle.

19. The semiconductor die-die inspection system of claim 16, wherein de-skewing the test image comprises:

determining, based on the skew angle, for each of the pixels in the test image, a column shift vector and a row shift vector, wherein the column shift vector comprises a quantity of pixels to shift collinear to the column containing the pixel and a direction; and the row shift vector comprises a quantity of pixels to shift collinear to the row containing the pixel and a direction; and shifting each of the pixels according to its column shift vector and row shift vector.

20. The semiconductor die-die inspection system of claim 15, wherein the partitioned translation comprises:

partitioning the reference image into at least one reference image sub-section;

partitioning the test image into at least one test image sub-section; and translating the test image sub-section to align with the reference image sub-section corresponding to the test image sub-section.

* * * * *